United States Patent
Kim et al.

(10) Patent No.: US 7,045,826 B2
(45) Date of Patent: May 16, 2006

(54) STRONTIUM SILICATE-BASED PHOSPHOR, FABRICATION METHOD THEREOF, AND LED USING THE PHOSPHOR

(75) Inventors: Chang Hae Kim, Daejeon (KR); Joung Kyu Park, Daejeon (KR); Hee Dong Park, Kyunggi-do (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 0 days.

(21) Appl. No.: 10/532,094

(22) PCT Filed: Mar. 26, 2004

(86) PCT No.: PCT/KR2004/000684

§ 371 (c)(1),
(2), (4) Date: Apr. 21, 2005

(87) PCT Pub. No.: WO2004/085570

PCT Pub. Date: Oct. 7, 2004

(65) Prior Publication Data

US 2006/0022208 A1    Feb. 2, 2006

(30) Foreign Application Priority Data

Mar. 28, 2003   (KR) .................... 10-2003-0019528

(51) Int. Cl.
*H01L 27/15*    (2006.01)
(52) U.S. Cl. ......................................... 257/98; 257/79
(58) Field of Classification Search .................... None
See application file for complete search history.

(56) References Cited

U.S. PATENT DOCUMENTS

| 4,152,483 A | * | 5/1979 | Kanda et al. |
| 5,839,718 A | | 11/1998 | Hase et al. |
| 6,429,583 B1 | | 8/2002 | Levinson et al. |
| 2002/0038861 A1 | | 4/2002 | Toda et al. |

FOREIGN PATENT DOCUMENTS

| EP | 1193306 | * | 3/2002 |
| JP | 54-78385 A | | 6/1979 |
| WO | 00/33389 A1 | | 6/2000 |

* cited by examiner

*Primary Examiner*—Nathan J. Flynn
*Assistant Examiner*—Kevin Quinto
(74) *Attorney, Agent, or Firm*—Morgan, Lewis & Bockius, LLP

(57) ABSTRACT

A strontium silicate-based phosphor, a fabrication method thereof, and an LED using the strontium silicate-based phosphor are provided. The phosphor is applied to a long wavelength ultraviolet LED, an active luminous LCD, etc., to enable an improvement in the color purity and to enhance the luminous efficiency. The strontium silicate-based phosphor is expressed by a chemical formula: $Sr_{3-x}SiO_5Eu^{2+}_x$ wherein x is $0<x\leq1$. The LED using the phosphor has a wide wavelength spectrum, shows a superior color purity characteristic, and can have a very high luminous efficiency as applied in the backlight source of an LED panel or an active luminous LCD.

20 Claims, 3 Drawing Sheets

STRONTIUM SILICATE-BASED PHOSPHOR, FABRICATION METHOD THEREOF, AND LED USING THE PHOSPHOR

TECHNICAL FIELD

The present invention relates to a strontium silicate-based phosphor, and more particularly, to a strontium silicate-based phosphor having a very high luminous efficiency as applied to a light emitting diode (LED) or an active luminous LCD by adding europium oxide ($Eu_2O_3$) as an activator to a base material of strontium silicate, mixing the two components, drying and thermally annealing the mixed two components under a specific condition. Further, the invention is directed to a method of fabricating the strontium silicate-based phosphor and an LED using the strontium silicate-based phosphor.

BACKGROUND ART

In general, to fabricate LEDs of blue, green, red and the like, it is required to first fabricate different substrates, such as InGaN substrate, GaN substrate, GaAs substrate, ZnO substrate. This requirement needs to use different semiconductor thin films, which causes the fabrication costs and unit price to be increased. Accordingly, if these LEDs can be fabricated using an identical semiconductor thin film, fabrication costs and investment costs can be remarkably reduced.

In the meanwhile, a white LED is gaining the popularity as the back light for the LCDs of a lighting device, a notebook computer, a handheld terminal and the like.

As a method for fabricating the white LED, there is a trial where a phosphor using a light emitted from an InGaN-based LED as the excitation energy source is further coated. For instance, the white LED is fabricated by coating a YAG:Ce (cerium) phosphor emitting a yellow light (wavelength: 560 nm) on a blue InGaN-based LED.

However, in emitting white light using the blue LED, besides the YAG:Ce or some organic luminescent materials, it is difficult to find out a proper phosphor excited by the blue LED.

In other words, the white LED using the blue LED is realized mainly using the YAG:Ce phosphor.

To solve the aforementioned drawbacks, it is strongly requested to introduce a new material capable of realizing yellow light instead of the YAG:Ce phosphor.

DISCLOSURE OF THE INVENTION

Accordingly, the present invention has been made to substantially obviate one or more of the problems due to limitations and disadvantages of the related art.

An object of the present invention is to provide a strontium silicate-based phosphor, which is excited by a GaN-based diode and has a wavelength band of 500–700 nm, and a fabrication method thereof.

To achieve these and other advantages and in accordance with the purpose of the present invention, as embodied and broadly described, there is provided a strontium silicate-based phosphor expressed by the following chemical formula:

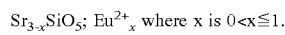

$Sr_{3-x}SiO_5$: $Eu^{2+}_x$ where x is $0 < x \leq 1$.

According to another aspect of the present invention, there is provided a method for fabricating a strontium silicate-based phosphor, the method comprising the steps of: forming a mixture where strontium carbonate ($SrCO_3$), silica ($SiO_2$), and europium oxide ($Eu_2O_3$) are mixed; drying the mixture; and performing a heat treatment of the dried mixture in a reducing atmosphere.

According to a further aspect of the present invention, there is provided an LED comprising: an LED chip; and a strontium silicate-based phosphor, which is excited by a light emitted from the LED chip and expressed by the following chemical formula: $Sr_{3-x}SiO_5$:$Eu^{2+}_x$ where x is $0 < x \leq 1$.

According to the present invention, there can be obtained a phosphor showing a wide wavelength spectrum and a stable luminescent characteristic for a long operation time and in a high operation temperature.

Accordingly, when the phosphor is applied in the long wavelength ultraviolet LED and the active luminous LCD, the color purity can be improved and the luminous efficiency can be enhanced.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

BEST MODE FOR CARRYING OUT THE INVENTION

Figure 1:
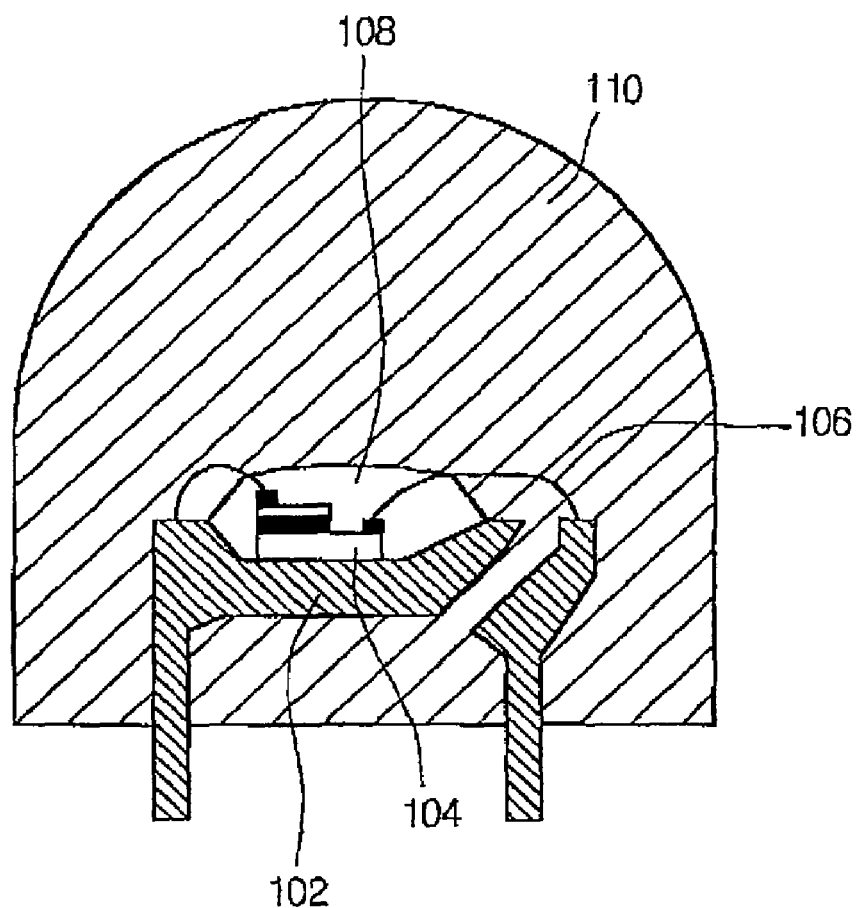
FIG. 1 is a schematic view of an LED to which the inventive strontium silicate-based phosphor is applied.

Hereinafter, preferred embodiments of the present invention will be described in detail with reference to accompanying drawings. It will be apparent to those skilled in the art that various modifications and variations can be made therein without departing from the spirit and scope of the invention. Thus, it is intended that the present invention cover the modifications and variations of this invention that come within the scope of the appended claims and their equivalents.

Hereinafter, a concrete embodiment on a fabrication method of a strontium silicate-based phosphor according to the spirit of the present invention will be described.

First, strontium carbonate ($SrCO_3$), silica ($SiO_2$), and europium oxide ($Eu_2O_3$) are weighed and are mixed with a solvent.

In detail, the above materials are weighed according to a desired composition ratio and are mixed with one another using acetone as the solvent for effective mixing. A ball milling or an agate mortar is used as a mixer of the solvent and the components of strontium carbonate ($SrCO_3$), silica ($SiO_2$), and europium oxide ($Eu_2O_3$).

The europium oxide ($Eu_2O_3$) used as an activator is added at a molar ratio of 0.001–0.5, preferably, 0.001–0.3 with respect to the strontium carbonate ($SrCO_3$).

When the europium oxide ($Eu_2O_3$) is added at a molar ratio less than 0.001, it fails to sufficiently function as the activator. Also, when the europium oxide ($Eu_2O_3$) is added at a molar ratio more than 0.5, the concentration quenching phenomenon occurs and the luminance is decreased.

Next, the mixture is dried in an oven. At this time, the drying temperature is set to be 100–150° C. and the drying time is set to be 1–24 hours.

After that, the dried mixture is loaded into a high purity aluminum boat and is heat-treated in a reducing atmosphere of a hydrogen-mixed gas in an electric furnace. If the heat treatment temperature is below 800° C., strontium silicate crystal is not completely created and thereby luminous efficiency is reduced, whereas if the temperature is beyond 1500° C., lowering in the luminance is caused due to overreaction. Accordingly, the heat treatment temperature is set to be 800–1500° C. and the heat treatment time is set to be 1–48 hours.

In detail, the hydrogen-mixed gas uses a nitrogen gas containing 2–25% by weight of hydrogen so as to make a reducing environment.

EXPERIMENTAL EXAMPLE

In the present experiment, to experiment the embodiment concretely, acetone is used as the solvent for weighing and mixing strontium carbonate ($SrCO_3$), silica ($SiO_2$), and europium oxide ($Eu_2O_3$), and a ball milling or agate mortar is used as a mixer of the solvent and the components of strontium carbonate ($SrCO_3$), silica ($SiO_2$), and europium oxide ($Eu_2O_3$).

Also, the drying temperature in the oven was 120° C., the drying time was 24 hours, the heat treatment temperature was 1,350° C., and the heat treatment time was 40 hours.

To form the reducing atmosphere, a mixture gas containing 5–25% of hydrogen is used.

A long wavelength ultraviolet white LED shown in FIG. 1 is fabricated using a strontium silicate-based yellow phosphor prepared by the above experiment and having a chemical formula of $Sr_{2.93}SiO_5$: $Eu^{2+}_{0.07}$, and an InGaN LED with a main peak of 460 nm.

FIG. 1 shows a structure of a long wavelength ultraviolet white LED to which the spirit of the invention is applied.

Referring to FIG. 1, a LED chip according to the spirit of the present invention is configured to include a reflection cup 102, an InGaN-based LED chip 104 disposed on the reflection cup 102, a phosphor 108, which is excited by a light emitted from the LED chip 104, an electrode line 106 connected to the LED chip 104, and an exterior material 110 made of a transparent resin, for molding and sealing the surrounding of the LED chip 104.

In detail, the InGaN-based LED 104 is connected with an external power through the electrode line 106. The phosphor 108 excited by the light emitted from the LED chip 104 is mixed with epoxy resin and the mixture is formed on an outer surface of the LED chip 104. The phosphor 108 and its surrounding are molded and sealed by the exterior material 110 of the decolored or a colored transparent resin.

It should be understood that the construction of the LED according to the present invention is not limited to the above embodiment but the element of the related art can be added, modified, or deleted. Alternatively, a white LED can be fabricated by mixing the phosphor 108 with silicon resin in addition to the aforementioned epoxy resin, and molding the LED chip and its surrounding by the mixture.

Also, the phosphor 108 is formed on an outer surface of the LED chip 104. By doing so, the light emitted from a luminescent layer of the LED chip 104 serves as the excitation light of the phosphor 108.

Here, the InGaN-based LED chip 104 generates a light with a wavelength of which main peak is 460 nm, and the phosphor 108 excited by the LED chip 104 uses the strontium silicate-based phosphor having a composition ratio of $Sr_{2.93}SiO_5$: $Eu^{2+}_{0.07}$.

Describing the operation of realizing the white light, the blue light (460 nm) emitted from the LED chip 104 passes through the strontium silicate phosphor. At this time, some of the blue light is used to excite the yellow phosphor composed of the strontium silicate, thereby realizing a yellow light, and the remaining light passes through the strontium silicate phosphor without any variation.

Accordingly, the excited yellow light that has passed through the yellow phosphor and the blue light that has passed through the yellow phosphor without any variation overlap with each other, thereby realizing the white light.

Figure 2:
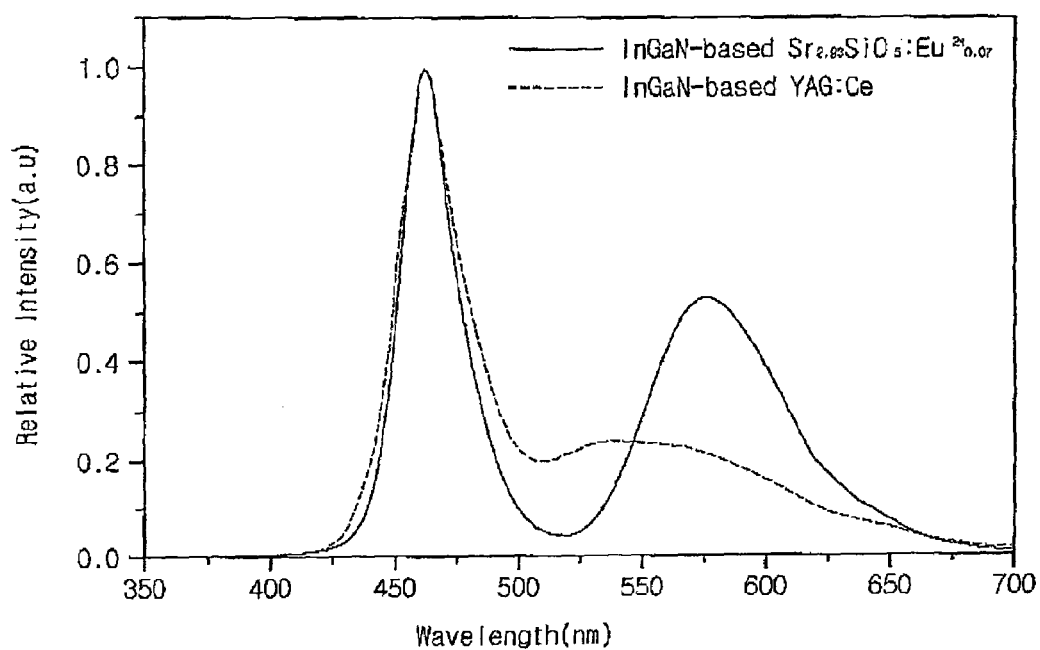
FIG. 2 is a graph showing a relative luminous spectrum of an white LED(InGaN) using the inventive strontium silicate-based phosphor of $Sr_{2.93}SiO_5$: $Eu^{2+}_{0.07}$, and an white LED (InGaN) using the conventional YAG:Ce yellow phosphor.

FIG. 2 is a graph showing the measurement results of luminous spectrum in the long wavelength ultraviolet LED chip (InGaN) fabricated using the inventive strontium silicate-based phosphor and a related art ultraviolet LED chip fabricated using the YAG:Ce yellow phosphor as a comparative example.

In the graph of FIG. 2, the solid line indicates the spectrum of the white LED fabricated using the inventive strontium silicate-based phosphor ($Sr_{2.93}SiO_5$:$Eu^{2+}_{0.07}$), and the dotted line indicates the spectrum of the LED fabricated using the related art YAG:Ce based phosphor, both using the related art InGaN chip.

Referring to FIG. 2, the light excited by the inventive strontium silicate-based phosphor shows the spectrum of a wide wavelength band of 500–700 nm, so the LED using the inventive strontium silicate-based phosphor shows the spectrum of a wide wavelength band of 400–700 nm. Also, it is understood that the brightness of the inventive LED is further improved compared with that of the comparative LED.

In addition, the inventive strontium silicate-based phosphor shows that high brightness characteristic is not changed for a long operation time and at a high operation temperature of about 250° C.

Accordingly, by using the strontium silicate-based phosphor according to the present invention, color purity can be improved. Also, when the strontium silicate-based phosphor according to the present invention is used in the long wavelength ultraviolet LED and the active luminous type LCD, it is possible to obtain a high light efficiency.

Figure 3:
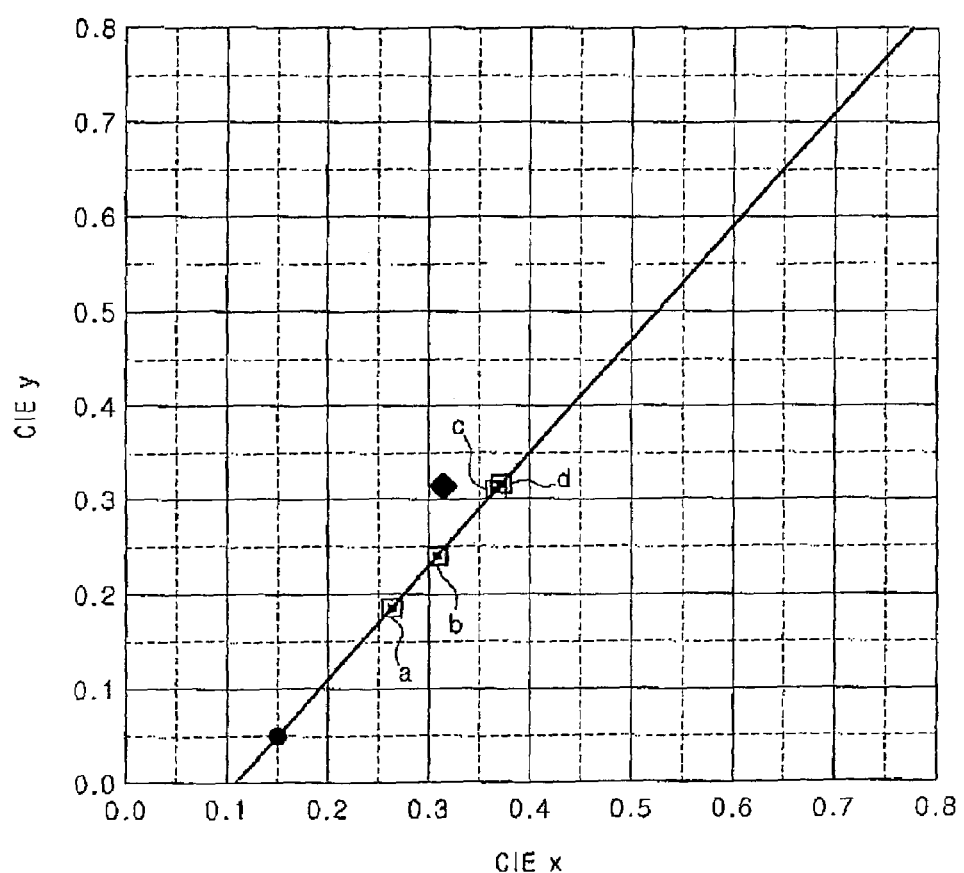
FIG. 3 is a graph showing variation of CIE color coordinate depending on a mixing ratio of epoxy resin and the inventive strontium silicate-based phosphor in an LED made by mixing an inventive strontium silicate-based phosphor of $Sr_{2.93}SiO_5$: $Eu^{2+}_{0.07}$, and epoxy resin and coating the mixed composition.

FIG. 3 is a graph showing variation of a CIE color coordinate ($_{(\blacksquare)}$) depending on a mixing ratio of epoxy resin and strontium silicate-based phosphor in an LED made by mixing an inventive strontium silicate-based phosphor of $Sr_{2.93}SiO_5$: $EU^{2+}_{0.07}$ and epoxy resin and coating the mixed composition.

In FIG. 3, the CIE color coordinate is used to express colors, and for the comparison, a CIE coordinate ($_{(\blacksquare)}$) of an LED chip itself emitting blue light and a CIE coordinate ($_{(\blacklozenge)}$) of a long wavelength ultraviolet LED chip (InGaN) using YAG:Ce yellow phosphor are shown together.

Points (a) through (d) are mixing ratios of epoxy resin and strontium silicate-based phosphor of $Sr_{2.93}SiO_5$: $Eu^{2+}_{0.07}$ coated on the LED chip. In the case of the point (a), the mixing ratio is 100 micro liters 0.01 grams, in the case of the point (b), the mixing ratio is 100 micro liters:0.015 grams, in the case of the point (c), the mixing ratio is 100 micro liters: 0.02 grams, and in the case of the point (d), 100 micro liters: 0.025 grams.

As shown in the graph of FIG. 3, in reviewing the variation of the CIE color coordinate (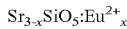) depending on the mixing ratio of the inventive strontium silicate-based phosphor, the color purity of the white light in the LED using the inventive strontium silicate-phosphor is improved more than the color purity of the white light in the comparative LED using the related art YAG:Ce phosphor.

INDUSTRIAL APPLICABILITY

As described previously, according to the inventive strontium silicate-based phosphor and fabrication method thereof, it is possible to obtain a phosphor having a wide wavelength spectrum, and capable of performing an effective light emission although using the blue LED as an excitation energy source. In particular, since the inventive phosphor shows a superior color purity characteristic in realizing the white light, it can improve the color purity and accordingly, can be applied in a high efficiency phosphor.

Also, when the inventive phosphor is employed for a backlight of a long wavelength ultraviolet LED and an active luminous LCD, it provides a very high luminous efficiency.

Further, since the inventive phosphor shows less variation in the luminous characteristic for a long operation time and at a high operation temperature of 250° C., it can operate stably.

The invention claimed is:

1. A strontium silicate-based phosphor expressed by the following chemical formula 1:

$$Sr_{3-x}SiO_5:Eu^{2+}_x \quad \text{Chemical formula 1}$$

where x is $0.001 < x \leq 1$.

2. A method of fabricating a strontium silicate-based phosphor, the method comprising the steps of:
   forming a mixture where strontium carbonate ($SrCO_3$), silica ($SiO_2$), and europium oxide ($Eu_2O_3$) are mixed;
   drying the mixture; and
   performing a heat treatment of the dried mixture in a reducing atmosphere to form $Sr_{3-x}SiO_5:Eu^{2+}_x$
   where x is $0 < x \leq 1$.

3. The method of claim 2, wherein the step of forming the mixture comprising the steps of:
   weighing the respective components of the mixture; and
   mixing the respective components with a solvent to form the mixture.

4. The method of claim 2, wherein the drying step is performed at a temperature range of 100–150° C.

5. The method of claim 2, wherein the drying step is performed for a time range of 1–24 hours.

6. The method of claim 2, wherein the drying step is performed at a temperature range of 100–150° C. for a time range of 1–24 hours.

7. The method of claim 2, wherein the drying step is performed using an oven.

8. The method of claim 2, wherein the heat treatment is performed at a temperature range of 800–1500° C.

9. The method of claim 2, wherein the heat treatment is performed for a time range of 1–48 hours.

10. The method of claim 2, wherein the heat treatment is performed at a temperature range of 800–1500° C. for a time range of 1–48 hours.

11. The method of claim 2, wherein the drying step is performed at a temperature range of 110–130° C. for a time range of 8–12 hours, and the heat treatment is performed at a temperature range of 1200–1400° C. for a time range of 2–5 hours.

12. The method of claim 2, wherein the reducing atmosphere of the heat treatment is made by a hydrogen-mixed gas.

13. The method of claim 2, wherein the heat treatment uses a nitrogen gas containing 2–25% by weight of hydrogen gas so as to make the reducing atmosphere.

14. An LED comprising:
    an LED chip; and
    a strontium silicate-based phosphor, which is excited by a light emitted from the LED chip and expressed by the following chemical formula 1:

$$Sr_{3-x}SiO_5:Eu^{2+}_x \quad \text{Chemical formula 1}$$

where x is $0 < x \leq 1$.

15. The LED of claim 14, wherein the light excited by the phosphor has a wavelength band of 500–700 nm.

16. The LED of claim 14, wherein the LED chip is placed on a reflection cup by which the emitted light is reflected.

17. The LED of claim 14, wherein the LED chip for exciting the phosphor is a blue LED chip.

18. The LED of claim 14, wherein the LED chip and the phosphor are molded by a transparent resin.

19. The LED of claim 14, wherein the phosphor is excited by the LED chip and emits a yellow light.

20. The LED of claim 14, emitting a white light.

* * * * *